United States Patent
Byeon

(10) Patent No.: US 7,668,019 B2
(45) Date of Patent: Feb. 23, 2010

(54) NON-VOLATILE MEMORY DEVICE AND ERASING METHOD THEREOF

(75) Inventor: Dae-Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/944,834

(22) Filed: Nov. 26, 2007

(65) Prior Publication Data

US 2008/0123436 A1 May 29, 2008

(30) Foreign Application Priority Data

Nov. 28, 2006 (KR) .................. 10-2006-0118537
Nov. 28, 2006 (KR) .................. 10-2006-0118538

(51) Int. Cl.
*G11C 16/04* (2006.01)
(52) U.S. Cl. .................. 365/185.29; 365/185.14; 365/185.17; 365/185.03; 365/185.11
(58) Field of Classification Search .......... 365/185.29, 365/185.14, 185.17, 185.03, 185.11
See application file for complete search history.

(56) References Cited

U.S. PATENT DOCUMENTS

| 6,493,265 | B2 | 12/2002 | Satoh et al. | |
|---|---|---|---|---|
| 6,594,178 | B2 | 7/2003 | Choi et al. | |
| 6,771,541 | B1 | 8/2004 | Park | |
| 2002/0133679 | A1* | 9/2002 | Choi et al. | 711/154 |
| 2004/0125629 | A1* | 7/2004 | Scheuerlein et al. | 365/17 |
| 2006/0114725 | A1* | 6/2006 | Jeong et al. | 365/185.29 |
| 2006/0133155 | A1 | 6/2006 | Fujita et al. | |
| 2007/0147136 | A1* | 6/2007 | Yoon et al. | 365/185.29 |

FOREIGN PATENT DOCUMENTS

| JP | 2000-236031 | | 8/2000 |
|---|---|---|---|
| JP | 2002-216487 | | 8/2002 |
| JP | 2003-257190 | | 9/2003 |
| JP | 2006-164408 | | 6/2006 |
| KR | 1020000010115 | A1 | 2/2000 |
| KR | 1020010061404 | A | 7/2001 |
| KR | 1020020036273 | A | 5/2002 |
| KR | 1020020048259 | A | 6/2002 |
| KR | 1020020060339 | A | 7/2002 |
| KR | 1020030029074 | A | 4/2003 |
| KR | 1020040084401 | A | 10/2004 |
| KR | 1020060055698 | A | 5/2006 |
| KR | 1020070031594 | A | 3/2007 |

* cited by examiner

*Primary Examiner*—Thong Q Le
(74) *Attorney, Agent, or Firm*—Volentine & Whitt, PLLC

(57) ABSTRACT

In one aspect, a non-volatile NAND-flash semiconductor memory device is provided which is configured to execute at least one of a pre-program operation and a post-program operation before and after an erase operation, respectively. Each of the pre-program and post-program operations includes applying a program voltage to a subset of a plurality of word lines defining a word line block of the memory device.

36 Claims, 16 Drawing Sheets

(a)

Erase (b)

NON-VOLATILE MEMORY DEVICE AND ERASING METHOD THEREOF

BACKGROUND OF THE INVENTION

1. Field of the Invention

The present invention generally relates to semiconductor memories, and more particularly, the present invention relates to non-volatile memory devices and to methods of erasing non-volatile memory devices.

A claim of priority under 35 U.S.C. §119 is made to Korean patent application nos. 10-2006-0118537 and 10-2006-0118358, both filed Nov. 28, 2007, the entireties of which are incorporated herein by reference.

2. Description of the Related Art

An example of the cell string structure of a conventional NAND flash memory device is illustrated in FIG. 1.

Referring to FIG. 1, a first cell string 10 includes flash memory cells MC<0:31> gated to respective word lines WL<0:31>. The flash memory cells MC<0:31> are connected in series between a ground select transistor GST and a string select transistor SST. The ground select transistor GST is gated to a ground select line GSL, and the string select transistor SST is gated to a string select line SSL. Also, as shown, the first cell string 10 is connected between a bit line 1HB_BL and a common select line CSL.

A second cell string 20 is similarly configured and includes flash memory cells MC<0':31'> gated to the respective word lines WL<0:31>. The flash memory cells MC<0':31'> are connected in series between a ground select transistor GST' and a string select transistor SST'. The ground select transistor GST' is gated to the ground select line GSL, and the string select transistor SST' is gated to the string select line SSL. The second cell string 20 is connected between a bit line PGM_BL and the common select line CSL.

Each flash memory cell MC may be single-bit memory element storing one-bit of data, or multi-bit memory element storing two or more bits of data. As is well-understood by those skilled in the art, data is stored in each cell by altering the threshold voltage of the cell. For example, each cell is programmed into one of two threshold distributions in the case of single-bit cells, and each cell is programmed into one of four threshold distributions in the case of two-bit cells.

FIG. 2 is a diagram for describing an example of the programming sequence utilized to program a multi-bit cell (MBC). In particular, the illustrated example is for programming of a two-bit flash memory cell. In the figure, the bell-curves denote threshold voltages distributions of different programmed states of the multi-bit flash memory cells, and VR1~VR3 denote read word line voltages which are utilized in a read operation of the multi-bit flash memory cells.

Generally, in NAND-type flash memory systems, memory cells are placed in an "erased state" prior to programming. In FIG. 2, the erased state is the lowest threshold voltage distribution and is assigned the two-bit data value of "11". The three higher threshold voltage distributions of the figure correspond to "programmed states" and are sequentially assigned two-bit data values of "10", "00" and "01". A sequence of three programming operations are selectively executed in order to program a cell from the erased state "11" to any one of the programmed states "10", "00" or "01". That is, a least-significant-bit (LSB) program (Program 1) operation is performed on cells where the LSB of the two-bit data value is to be changed from "1" to "0". A first most-significant-bit (MSB) program (Program 2) operation is performed on cells where the LSB has been changed in Program 1 and where the MSB of the two-bit data value is to be changed from "1" to "0". A second MSB program (Program 3) is performed on cells where only the MSB is to be changed from "1" to "0".

Referring to the circuit diagram of FIGS. 3 and 4, the programming of the memory cell "B" (FIG. 4) illustrated therein will now be explained. As shown, the memory cell B (i.e., the program cell B) is coupled to word line WL28 and program bit line PGM_BL. The NAND string having the program bit line PGM_BL is referred to herein as a program string. FIG. 4 also illustrates a memory cell "A" connected to the word line WL28 and bit line IHB_BL. This memory cell is not to be programmed and is referred to as an inhibit cell A contained within an inhibit string.

Conventionally, programming operations are executed in sequence from word line WL0 to word line WL31. Referring to FIG. 3, after an initial set-up period (t1~t3) in which the string select line SSL is brought to voltage (Vsel) between VCC and a threshold voltage Vth, a pass voltage Vpass (e.g., about 8V) is applied to each of the word lines WL<0:31>. Then, at time t3, the voltage of the word line WL28 rises to a program voltage Vpgm (e.g., about 18V). During this time, programming of the threshold voltage of memory cell B occurs. Then, at time t5, the voltage of the word line WL28 begins to drop, and at time t6, all the word line WL voltages are dropped to 0V.

Upon programming of the program cell B, a voltage of 0V is applied to the bulk thereof through the 0V applied to the bit line PGM_BL, and the program voltage Vpgm is applied to the word line WL28. In this state, F-N tunneling is induced in the program cell B, thus increasing the threshold voltage thereof as is well known in the art. In the meantime, F-N tunneling within the inhibit cell A does not occur due to self-boosting of the bulk thereof resulting from the application of the reference voltage VCC to the inhibit bit line 1HB_BL.

In the example of FIG. 4, the memory cells in the inhibit string are in the erased state ("11"). The resultant low threshold of the cells creates a high boosting efficiency, the preventing F-N tunneling in these cells. In contrast, FIG. 5 illustrates an example in which a memory cell D of a program string is to be programmed, and a memory cell C of an inhibit string is to be programmed inhibited. The memory cells connected to the word lines WL<0:27> of the inhibit string are in a programmed state "00". In this case, the boosting efficiency is low, and a charge sharing effect among the cells of the inhibit string can disadvantageously induce F-N tunneling in the cells. This is generally referred to as a "program disturbance" effect.

Program disturbance can be reduced by implementing a "local boosting scheme." Referring to FIG. 6 (where the D cell is to be programmed), the local boosting scheme is executed, for example, by applying a voltage Vlocal (e.g., ~2V) to one or more word lines preceding the word line receiving the program voltage Vpgm. In the example of FIG. 6, the program voltage is applied to word line WL28, and the voltage Vlocal is applied to the two preceding word lines WL27 and WL26. The remaining word lines receive the voltage Vpass. Program disturbance is reduced by blocking the charge sharing to the adjacent memory cells MC<0:25> of the program inhibited E cell in the inhibit string. However, if the memory cells MC26 and MC27 are in erased states ("11"), local boosting may not sufficiently block the charge sharing path in the inhibit string.

Conventional techniques described above can suffer from over-erasure of memory cells. As shown in FIG. 7, the top figure (a) illustrates a normal distribution of threshold voltages where, as explained earlier, the state "11" is an erase state. The reference character "x1" in the figure denotes the threshold voltage of the program inhibited E cell of FIG. 6 in an erased state. After a program operation (of the F cell) utilizing local boosting, the threshold voltage of the E cell may fall below the normal distribution. This is illustrated by reference character "x2" in the lower diagram (b) of FIG. 7. As a result, subsequent programming of the E cell may result in errors. In an effort to obviate this problem, it is possible to execute pre-program (or post-program) operations in conjunction with each erase routine. However, such operations add significantly to the overall processing time.

SUMMARY

According to an aspect of the present invention, a non-volatile NAND-flash semiconductor memory device is provided which is configured to execute at least one of a pre-program operation and a post-program operation before and after an erase operation, respectively. Each of the pre-program and post-program operations includes applying a program voltage to a subset of a plurality of word lines defining a word line block of the memory device.

According to another aspect of the present invention, memory device is provide which includes a memory cell array comprising a plurality of non-volatile memory strings, where each of the non-volatile memory strings include a plurality n of non-volatile memory cells, and where n is an integer. The memory device further includes a plurality n of word lines intersecting the respective n non-volatile memory cells of each of the non-volatile memory strings, a decoder configured to apply voltages to the word lines in response to an address, and an erase controller which supplies voltages to the decoder to execute at least one of a pre-program operation and a post-program operation before and after an erase operation, respectively. Each of the pre-program and post-program operations includes applying a program voltage to a subset of a plurality of word lines defining a word line block of the memory device.

According to yet another aspect of the present invention, an electronic system is provided which includes a microprocessor operatively coupled to a non-volatile memory device. The non-volatile memory device is configured to execute at least one of a pre-program operation and a post-program operation before and after an erase operation, respectively, each of the pre-program and post-program operations including applying a program voltage to a subset of a plurality of word lines defining a word line block of the memory device.

According to still another aspect of the present invention, a method of operating a NAND-type flash memory device is provided which includes providing a program voltage to a subset of word lines of a word line block during at least one of a pre-program and post-program operation executed before or after an erase operation.

According to another aspect of the present invention, a method of controlling a NAND-type non-volatile memory device is provided which includes executing a pre-program operation in which a program voltage is applied to a first set of word lines of a word line block, and a pass voltage is applied to a remaining set of word lines of the word line block, and executing an erase operation of the word line block after the pre-program operation.

According to still another aspect of the present invention, a method of controlling a NAND-type non-volatile memory device is provided which includes executing an erase operation of a word line block, and executing a post-program operation in which a program voltage is applied to a first set of word lines of a word line block, and a pass voltage is applied to a remaining set of word lines of the word line block.

BRIEF DESCRIPTION OF THE DRAWINGS

The above and other aspects and features of the present invention will become readily apparent from the detailed description that follows, with reference to the accompanying drawings, in which.

DETAILED DESCRIPTION

Figure 1:
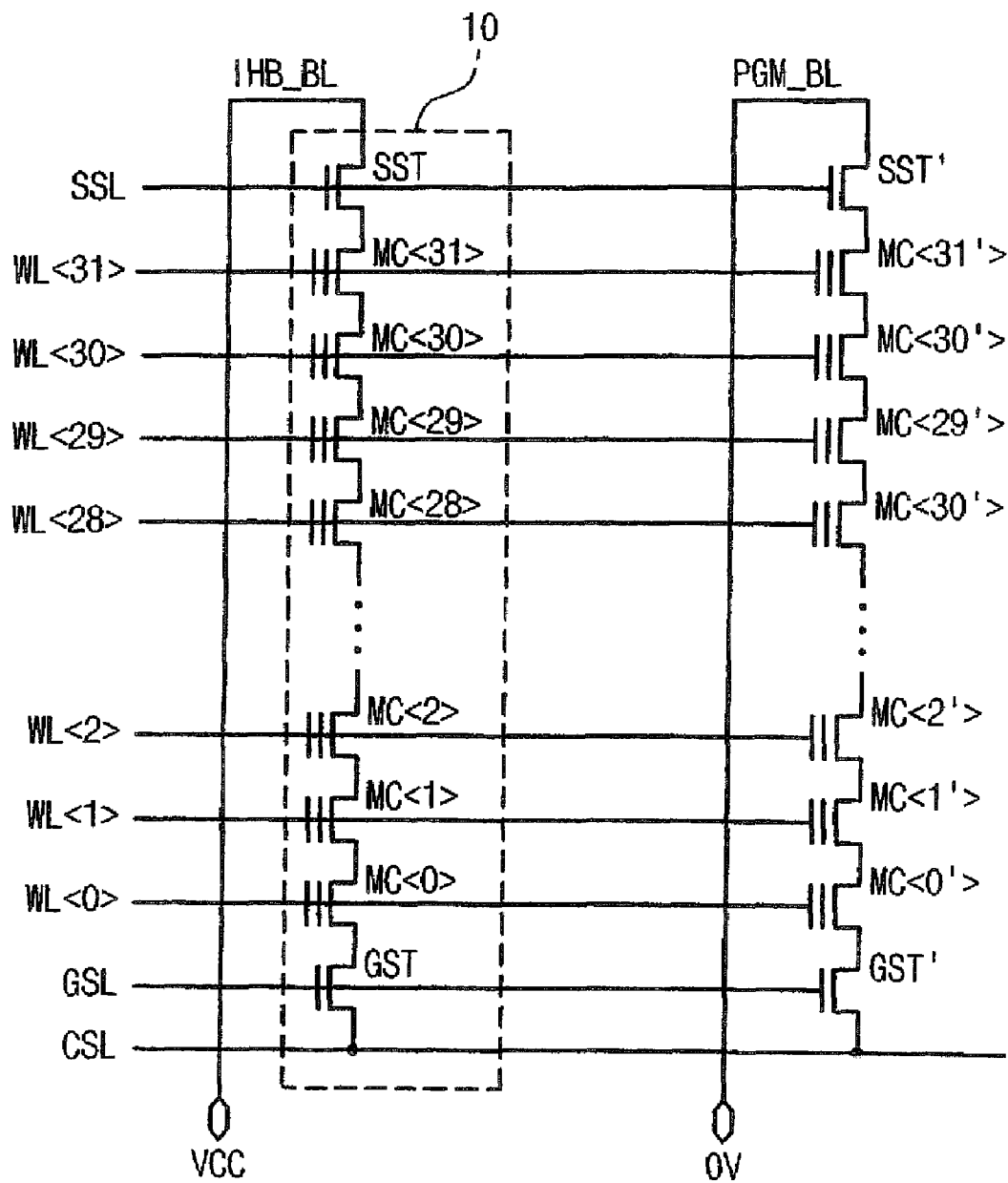
FIG. 1 illustrates NAND strings of a conventional non-volatile memory device.
Figure 2:
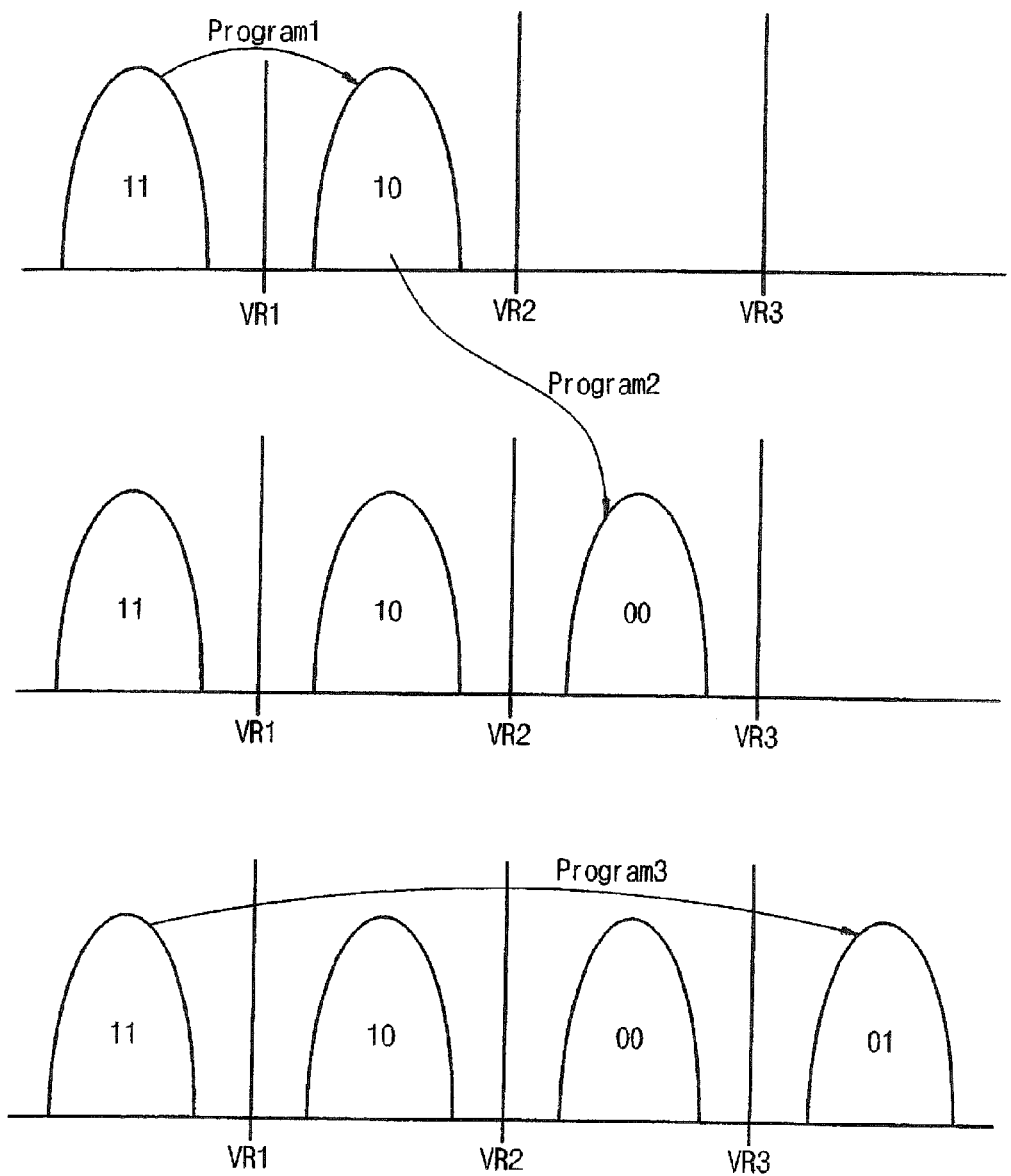
FIG. 2 illustrates threshold voltage diagrams for describing the programming of a conventional non-volatile memory device.
Figure 3:
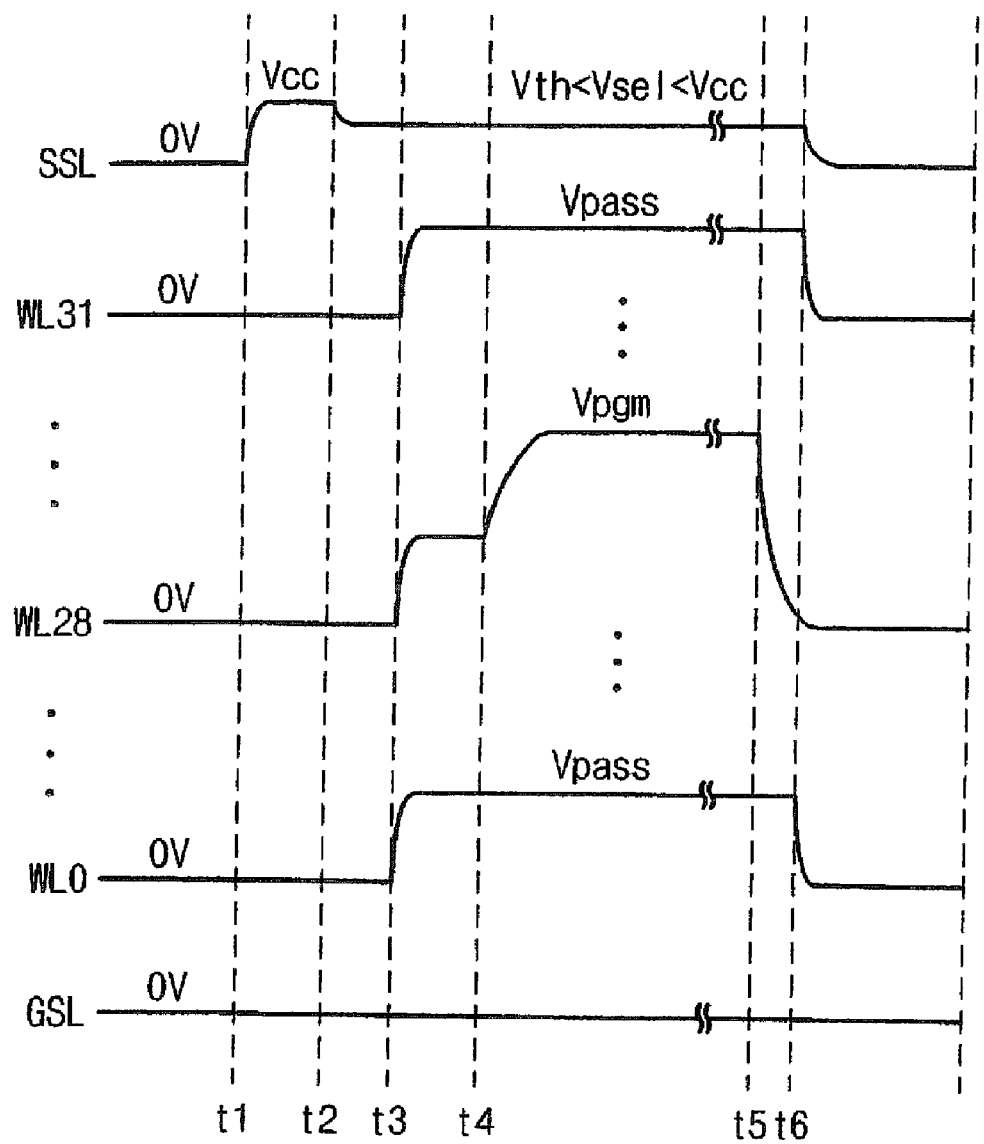
FIG. 3 illustrates voltages applied to word lines during programming of a conventional non-volatile memory device.
Figure 4:
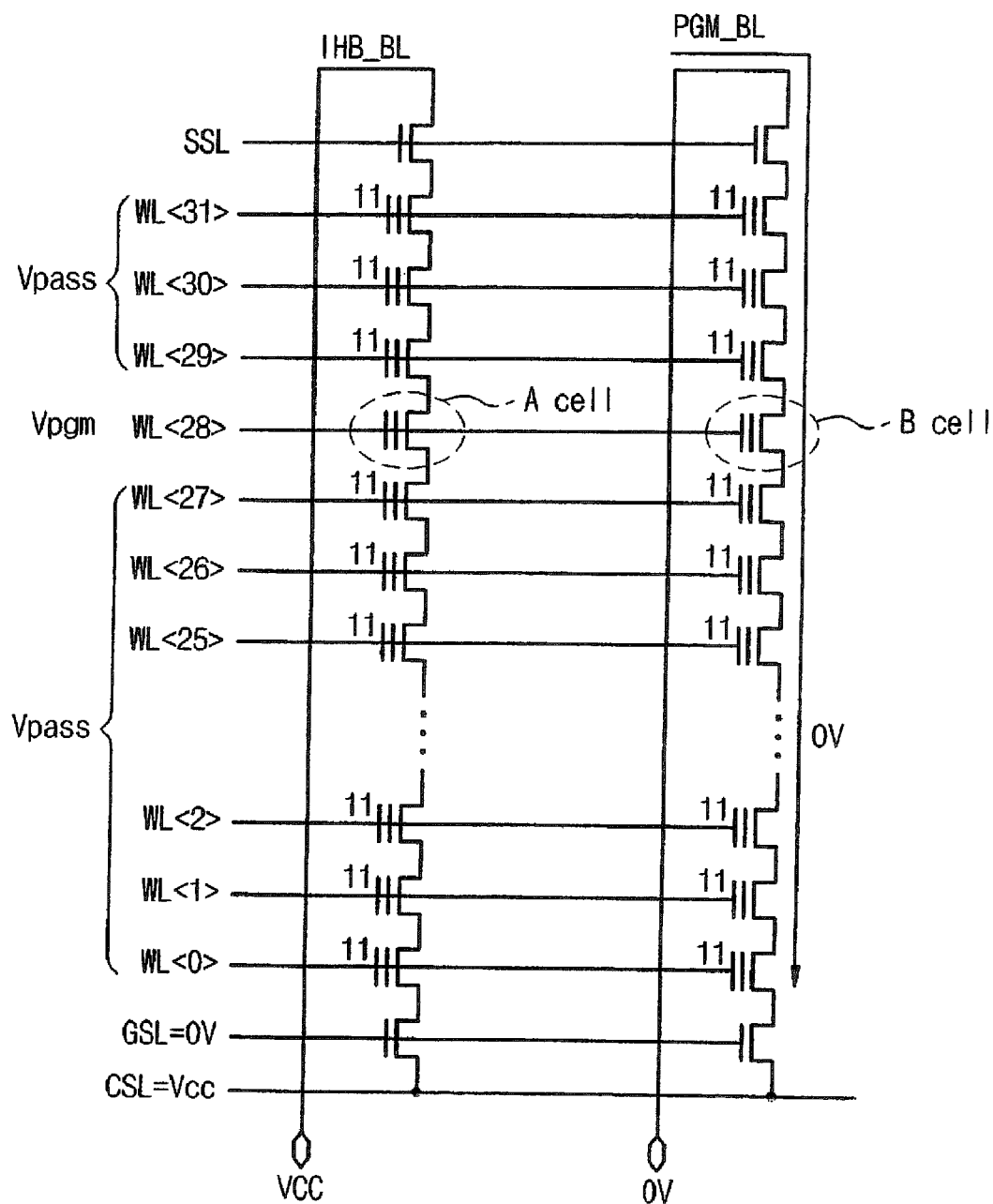
FIGS. 4 through 6 illustrate NAND strings for describing programming, charge sharing, and local boosting schemes of a conventional non-volatile memory device.
Figure 5:
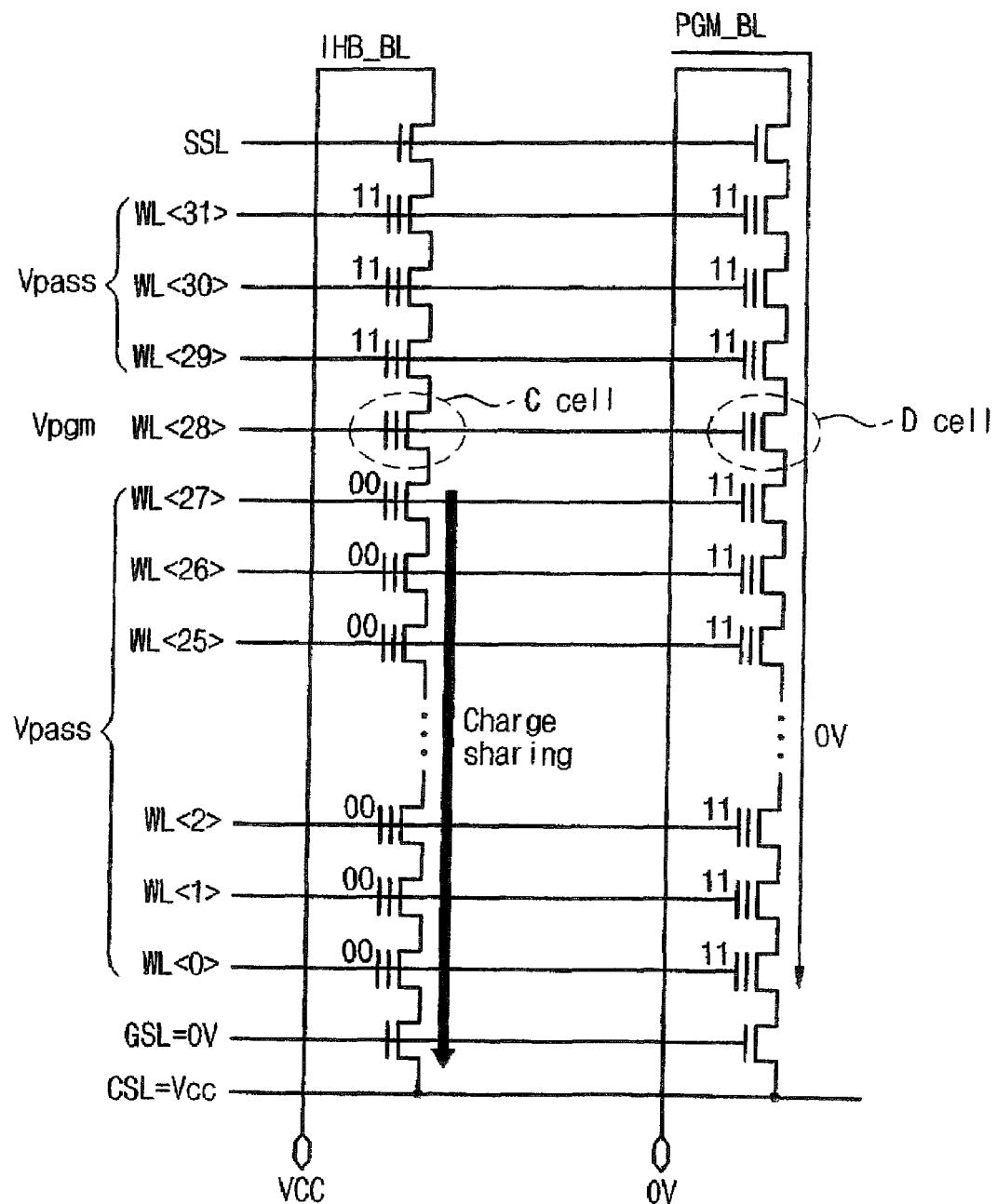

The present invention will now be described by way of several preferred, but non-limiting, embodiments of the invention. The embodiments are presented as examples only, and the invention is not considered to be limited to the specific configurations and/or features of the exemplary embodiments. It will be understood that when an element is referred to as being "on", "connected to" or "coupled to" another element, it can be directly on, connected or coupled to the other element or intervening elements may be present. In contrast, when an element is referred to as being "directly on," "directly connected to" or "directly coupled to" another element, there are no intervening elements present.

One or more embodiments of the present invention are directed to a non-volatile semiconductor memory device which is configured to execute a pre-program operation and/or a post-program operation before and after an erase operation, respectively. The pre-program and/or post-program operations are generally characterized by application of a program voltage to a subset of a plurality of word lines defining a word line block of the memory device. A pass voltage, for example, may be applied to remaining word lines of the word line block during each of the at least one of the pre-program and post-program operations.

The execution of pre-program and/or post-program routines in conjunction with an erase operation is generally known in the art. See, for example, U.S. Pat. No. 6,842,378, entitled "Flash Memory Device And Method Of Erasing The Same." The primary purpose is to prevent over-erasure of memory cells. According to these schemes, all word lines WL of a given memory block are sequentially pre-programmed (or post-programmed) prior to (or after) an erase operation. However, substantial time and resources are needed in the sequential execution these programming operations.

In contrast, in accordance with embodiments of the present invention, a subset of the word lines WL of each block are pre-programmed (and/or post-programmed) in conjunction with an erase operation. The subset of word lines WL is preferably located in an upper area of the word line block. Here, as will be explained later, the "upper area" is a relative term which refers to word lines WL located later in the programming sequence.

In addition, the memory device may be configured to execute a local boosting scheme during a normal programming operation, and/or during one or both of the pre-program and post-program operations.

The same program voltage may be applied to each of the subset of word lines in the pre-program and post-program operations, or different program voltages may be applied to each of the subset of word lines in the pre-program and post-program operations. Likewise, for example, a same pass voltage may be applied to each of the remaining word lines in the pre-program and post-program operations, or different pass voltages may be applied to each of the remaining word lines in the pre-program and post-program operations.

Figure 8:
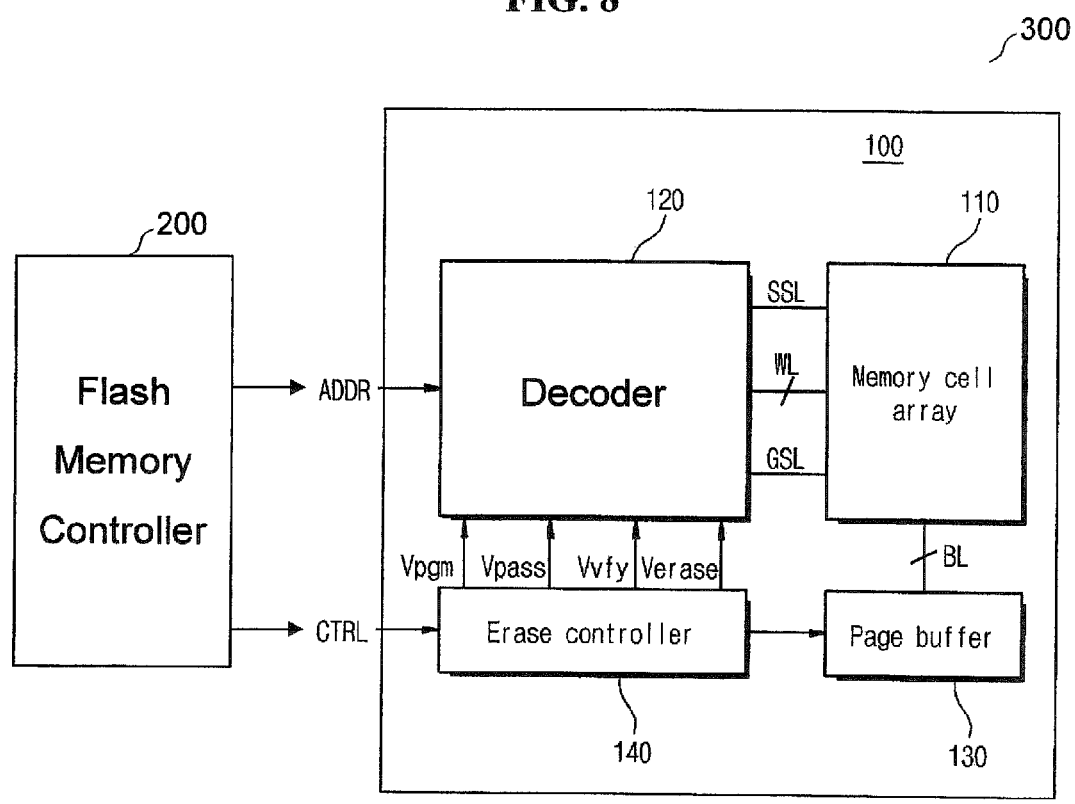
FIG. 8 is a block diagram of a memory system according to an embodiment of the present invention.

FIG. 8 is a block diagram of a memory system according to an embodiment of the present invention. In the illustrated example, the memory system 300 includes a flash memory controller 200 and a flash memory device 100. The flash memory device 100 may, for example, be constituted as a flash memory card or as the non-volatile memory of a processor-driven appliance, such as an MP3 player.

The flash memory controller 200 is an integrated circuit which supplies various command/control (CTRL) signals and address (ADDR) signals to the flash memory device 100. The operation and physical implementation of such controllers 200 are well-understood in the art.

The flash memory device 100 includes a memory cell array 110, a decoder 120, a page buffer 130, and an erase controller 140. The components of the flash memory device 100 illustrated in FIG. 8 are those which are relevant to operational aspects of embodiments of the present invention. The exemplary embodiment of the flash memory device 100 may include additional functional blocks not illustrated, and the particular block configuration illustrated in FIG. 8 may be altered while still falling within the spirit and scope of the present invention. Additionally, the internal configuration of each functional block of FIG. 8 may be varied any number of ways as a matter of design choice.

The memory cell array 10 of this embodiment is implemented by flash memory cells connected to define a plurality of NAND flash strings and including intersecting bit lines (BL) and word lines (WL). The bit lines BL of the memory cell array 110 are connect to the page buffer 130. The memory cell array 110 may include a plurality of memory blocks and pages. Each block may be defined by a plurality of NAND flash strings connected to common word lines WL, and each page may be defined by a plurality of memory blocks connected to common bit lines BL.

The page buffer page buffer 130 of this embodiment is an integrated circuit which supplies write data and retrieves read data from each page of the memory cell array 110.

The decoder 120 of this embodiment is an integrated circuit which decodes the address signals ADDR supplied from the memory controller 200 and supplies various programming voltages (e.g., Vpgm, Vpass, Vvfy, and Verase) to word lines WL of the memory cell array 110 according to the decoded address signals ADDR.

The erase controller 140 of this embodiment is an integrated circuit which is responsive to the control/command CTRL signals from the memory controller to selectively supply the programming voltages (e.g., Vpgm, Vpass, Vvfy, and Verase) to the decoder 120. In addition, the erase controller 140 is capable of commanding (or enabling) the page buffer 130 to execute, for example, a read verify operation.

The pre-programming and post-programming operations of the memory system 300 of the example of FIG. 8 will be described below in the form of exemplary embodiments of the invention.

As discussed above, the execution of pre-program and/or post-program operations of each word line of a memory block in conjunction with an erase routine of the memory block is generally known in the art. However, embodiments of the present invention are characterized in that a subset of the word lines WL of each block are pre-programmed (and/or post-programmed) in conjunction with an erase operation. On example of this is illustrated in FIG. 9.

Figure 9:
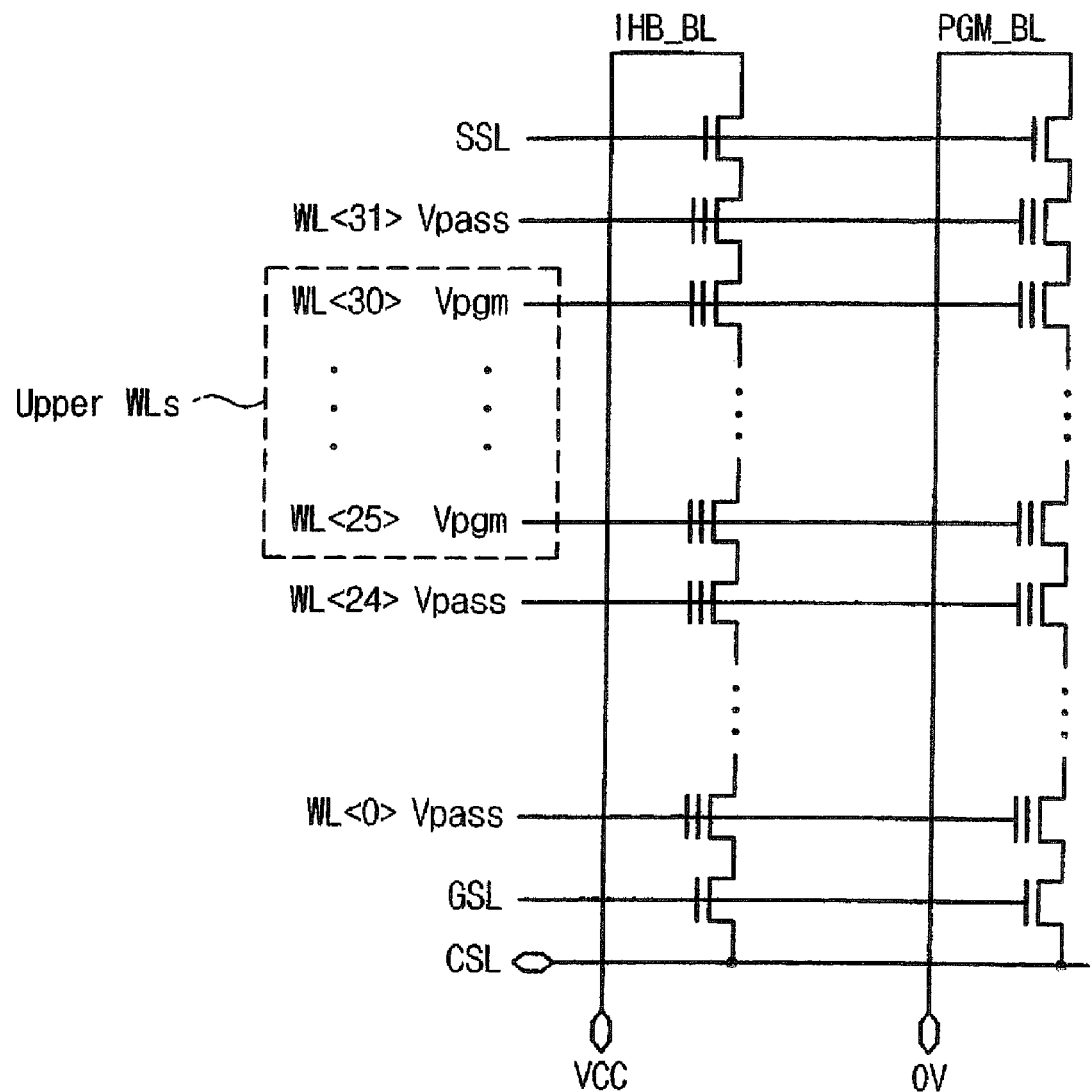
FIGS. 9 through 12 illustrate NAND strings for describing post-program and pre-program operations according to embodiments of the present invention.

FIG. 9 illustrates a program NAND string and an inhibit NAND string of a memory block of the memory cell array 110. The inhibit NAND string includes a bit line 1HB_BL connected to the reference voltage VCC, and the program NAND string includes a bit line 1HB_BL connected to a voltage of 0V. As shown, each string is connected to a string select line SSL, a ground select line GSL, a column select line CSL, and a plurality of word lines WL<0:31>.

Figure 6:
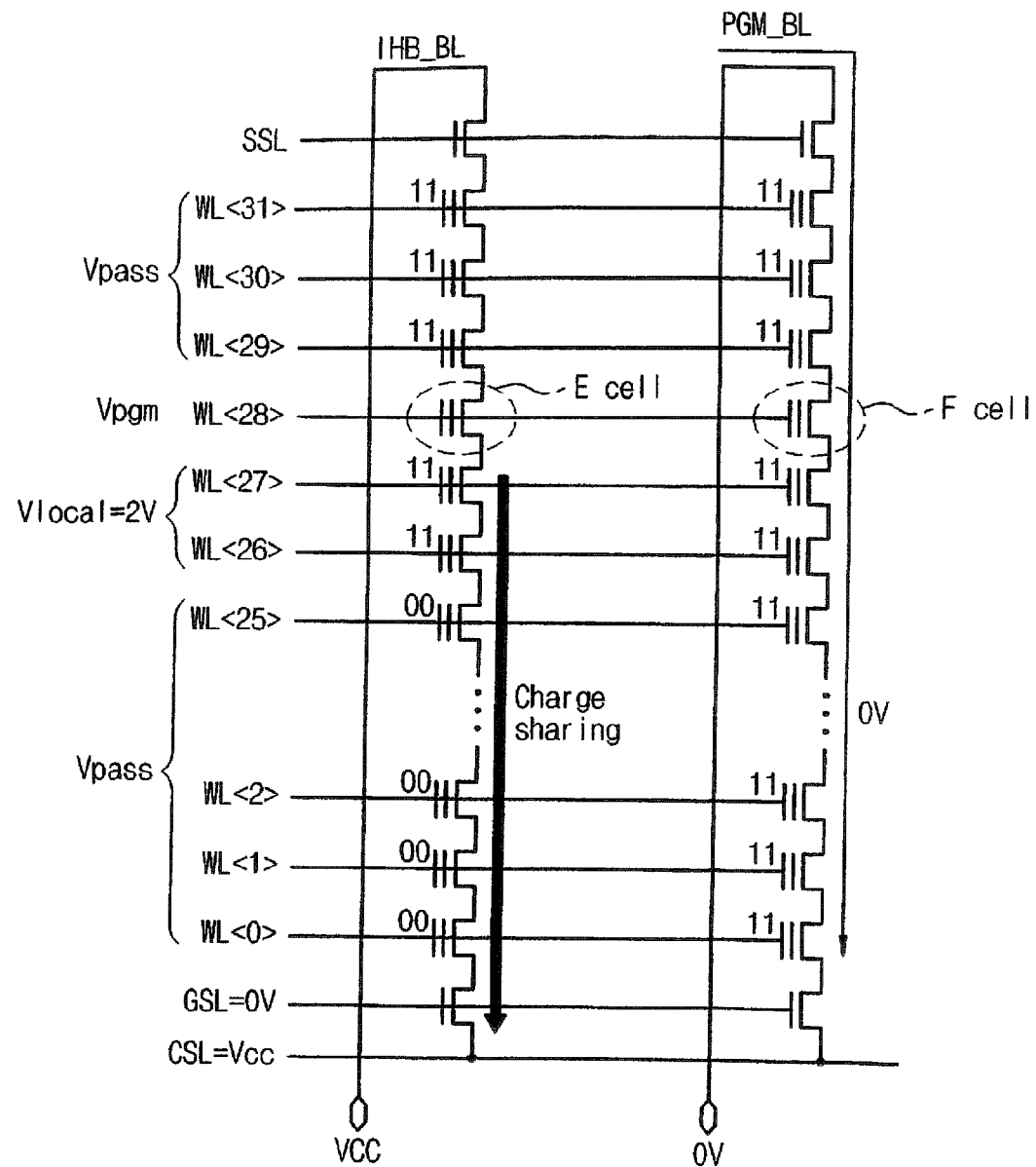
Figure 7:
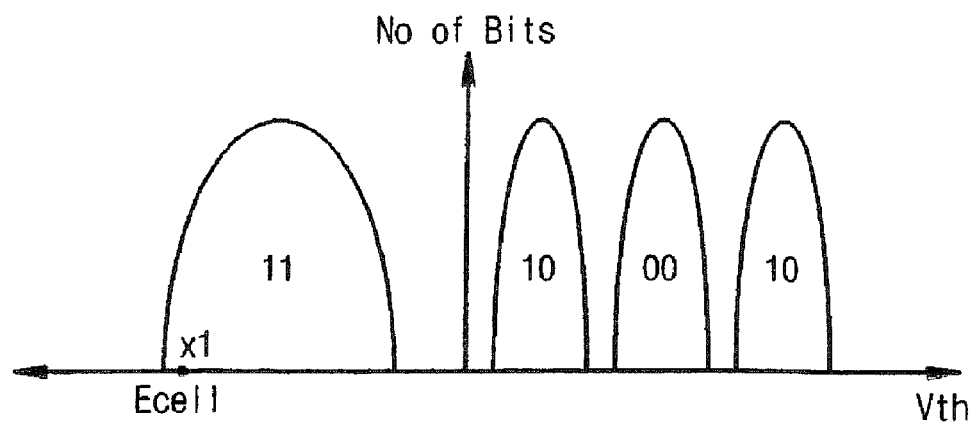
FIG. 7 illustrates threshold voltage diagrams for describing over-erasure of memory cells in a conventional non-volatile memory device.
Figure 7:
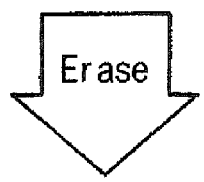
Figure 7:
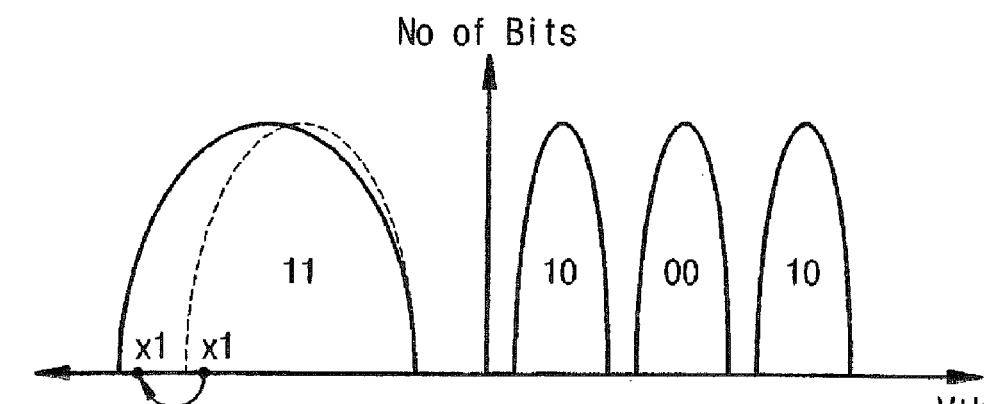

During a normal programming sequence, which may optionally include a local-boosting scheme (see, e.g., previous discussed FIG. 6), programming is executed in sequence from word line WL0 to word line WL31. However, in the embodiment of FIG. 9, pre-programming and/or post programming routines of an erase operation are executed with respect to only the upper word lines WL<25:30>. This is represented in FIG. 9 by application of the voltage Vpass to word lines WL<0:24> and WL31, and by application of the program voltage Vpgm to the upper word lines WL<25:30>. In particular, the pre-programming and/or post-programming may be executed in sequence from word line WL25 to word line WL30. Further, although not shown, the pre-programming and/or post-programming routines may optionally implement a local boosting scheme by applying local voltages (Vlocal) to one or more adjacent and preceding word lines WL of a word line WL being applied with the program voltage Vpgm among the upper word lines WL<25:30>. See FIG. 6 and the corresponding previous discussion herein.

In the embodiment of FIG. 9, the uppermost word line WL31 is not included among the upper word lines WL<25:30> since it is sequentially adjacent of the string select line SSL. As such, charge sharing is not a significant issue of concern. However, the embodiment is not limited to the omission of the word line WL31 from the among the word lines for which pre-programming and/or post-programming is executed.

Also in the embodiment of FIG. 9, the upper word lines WL<25:30> are contained in the upper half of the memory block, and include the penultimate word line WL30. This is deemed preferable, but embodiments of the invention are not limited in this respect.

The embodiment of FIG. 9 at least partially derives from the realization that the adverse effects (e.g., over-erasure) resulting from charge sharing have a greater impact in the memory cells of the inhibit string which are located later in the normal programming sequence. By limiting the pre-programming and post-programming to these highly affect word lines, the processing time for the erase operation is reduced.

The advantages attendant the present invention can be achieved in a variety of ways, and alternative examples will be described next with reference to FIGS. 10 through 12.

Figure 10:
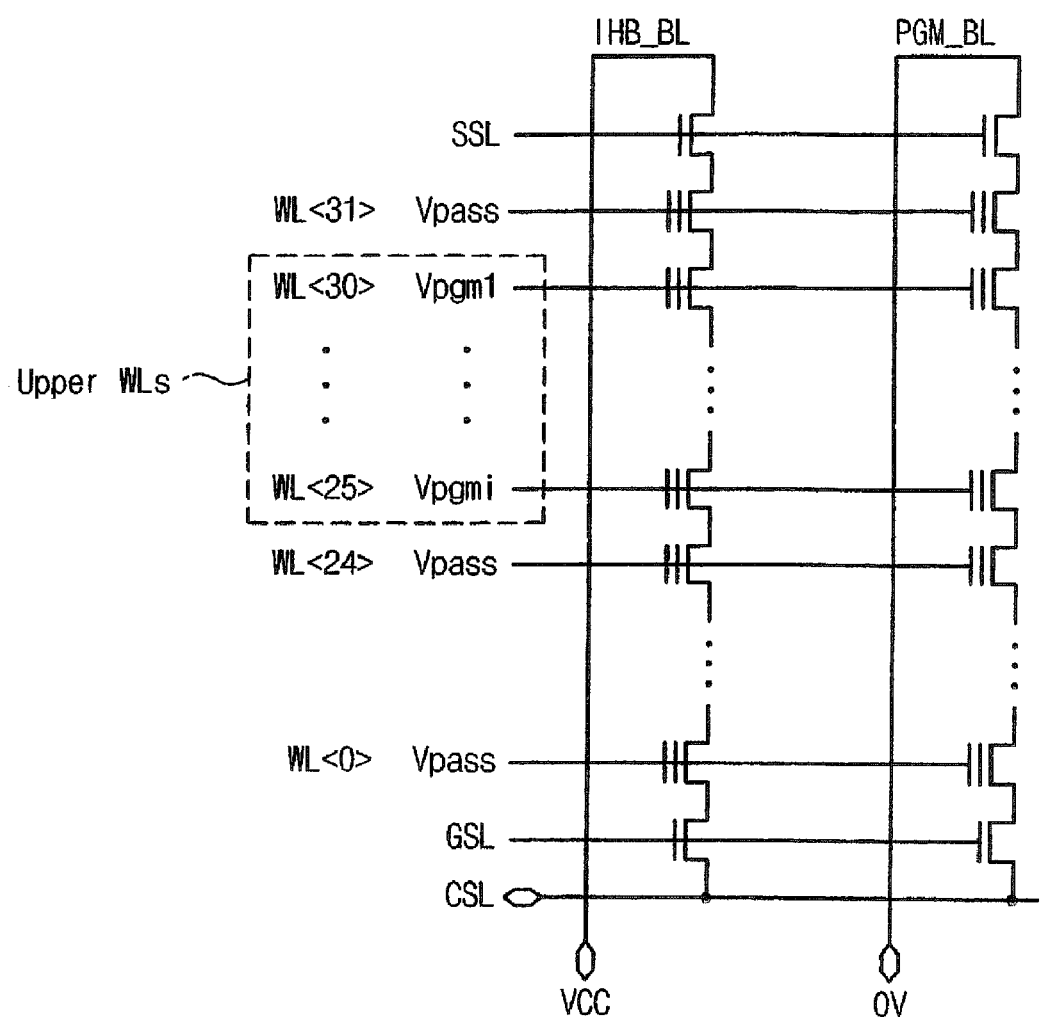

FIG. 10 illustrates an alternative embodiment in which the upper word lines WL<25:30> are applied with different programming voltages Vpgmi . . . Vpgm1 during the pre-programming and/or post-programming operations of the erase routine.

Figure 11:
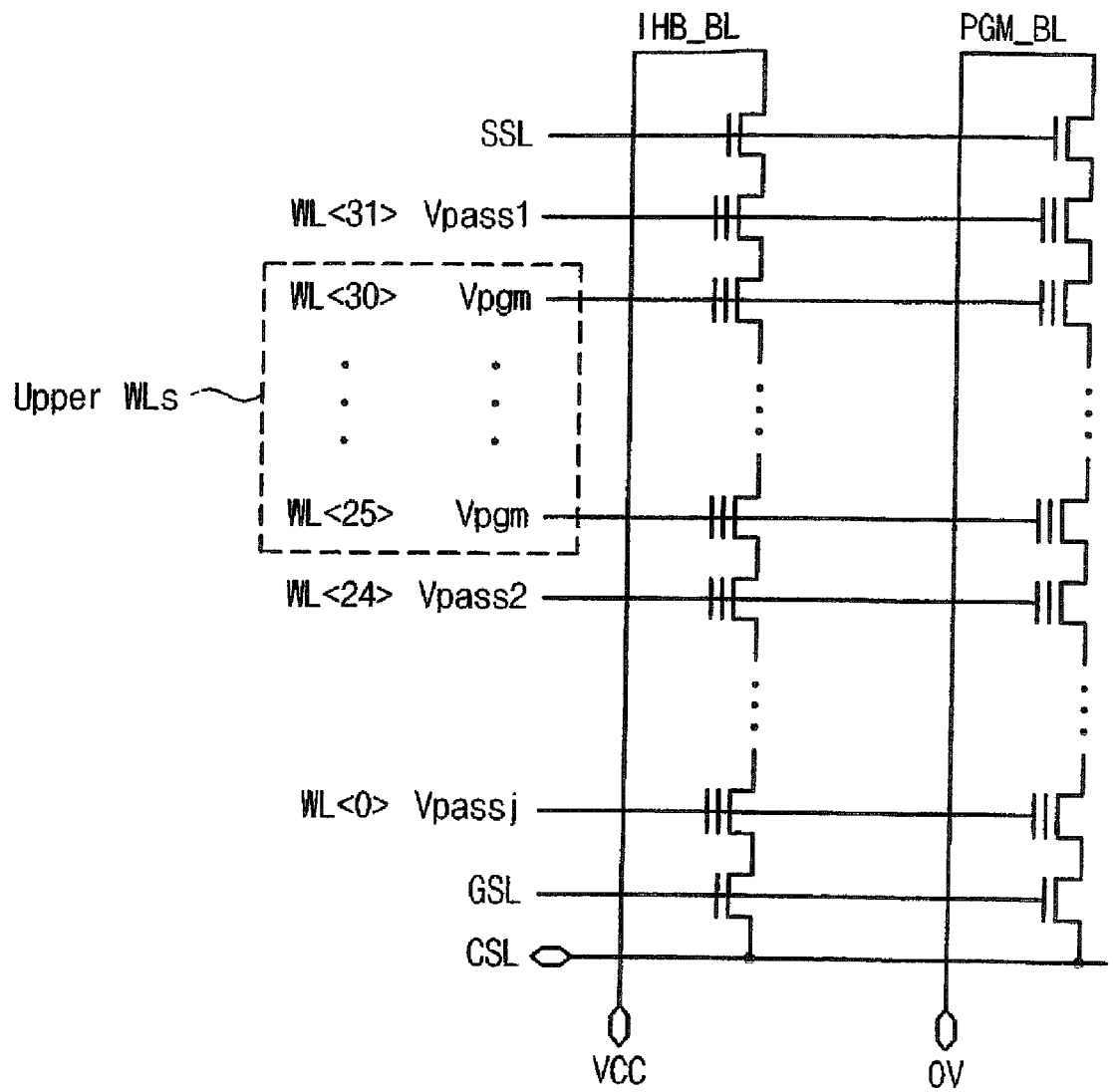

FIG. 11 illustrates another alternative in which the word lines WL<0:24> and WL31 (i.e., the word lines WL not included in the upper word line group) are applied with different pass voltages Vpassj . . . Vpass1.

Figure 12:
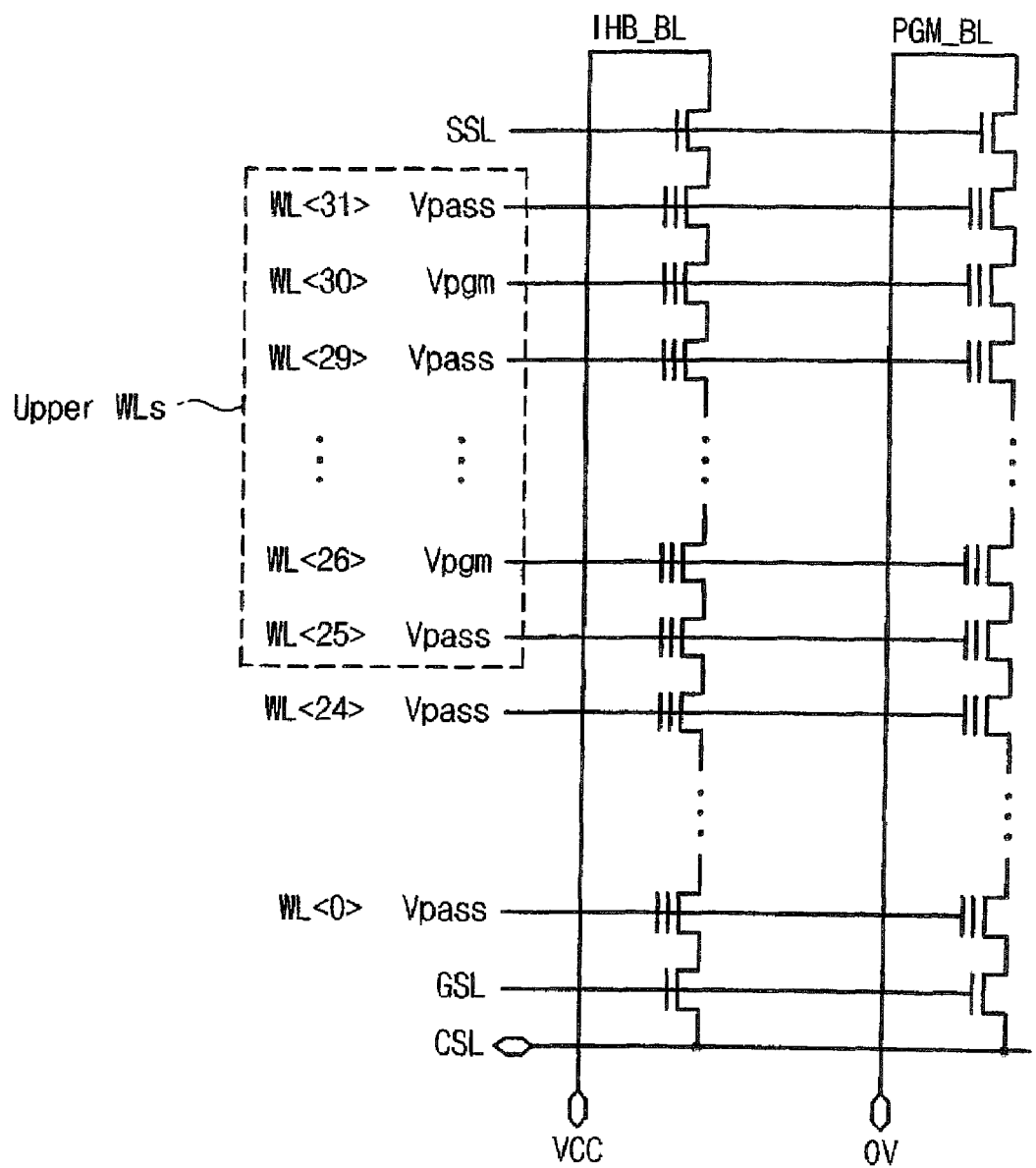

FIG. 12 illustrates another alternative in which pre-programming and/or post-programming are executed every other word line WL within upper word lines WL<25:3 1>. This is represented in FIG. 12 by application of the pass voltage Vpass to the odd-numbered WL among the upper word lines WL<25:31>, and by application of the program voltage Vpgm to the even-numbered word lines WL among the upper word lines WL<25:31>.

Erase operations according to exemplary embodiments of the present invention will be described below with reference to FIG. 13 through 18. Referring again to FIG. 8, however, it will be understood that the erase operations are executed under control of the erase controller 140 in response to commands from the flash memory controller 200. In particular, the erase controller 140 is responsive to the flash memory controller 200 to execute a given (pre-programmed) erase routine (such as one of those illustrated in FIGS. 13-18). The voltages utilized in the erase routine (e.g., Vpgm, Vpass, Vvfy and Verase) are selectively supplied to the decoder 120, and the decoder 120 is responsive to the address signal ADDR to supply appropriate voltages to the word lines WL of the memory cell array 110. Also, the page buffer 130 is responsive to the erase controller 130 to execute, for example, a read verify operation.

Figure 13:
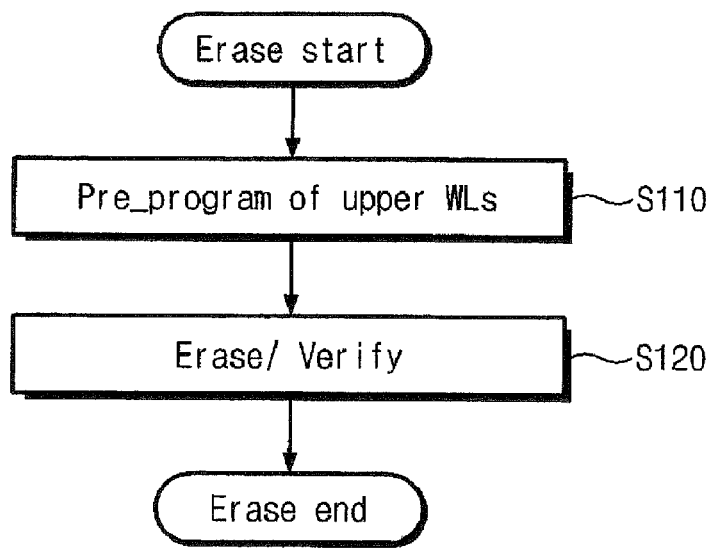
FIGS. 13 through 18 are flow charts for describing erase routines according to embodiments of the present invention.

FIG. 13 is a flow chart of an erase routine according to an embodiment of the present invention. In a first step S110, a pre-program operation is executed in which upper word lines WL of a word line block are pre-programmed. See, for example, the upper word lines WL<25:30> of FIG. 9. Then, at step S120, the memory block is erased and an erase verify operation is conductive to confirm the erase ("11") state of each memory cell.

Figure 14:
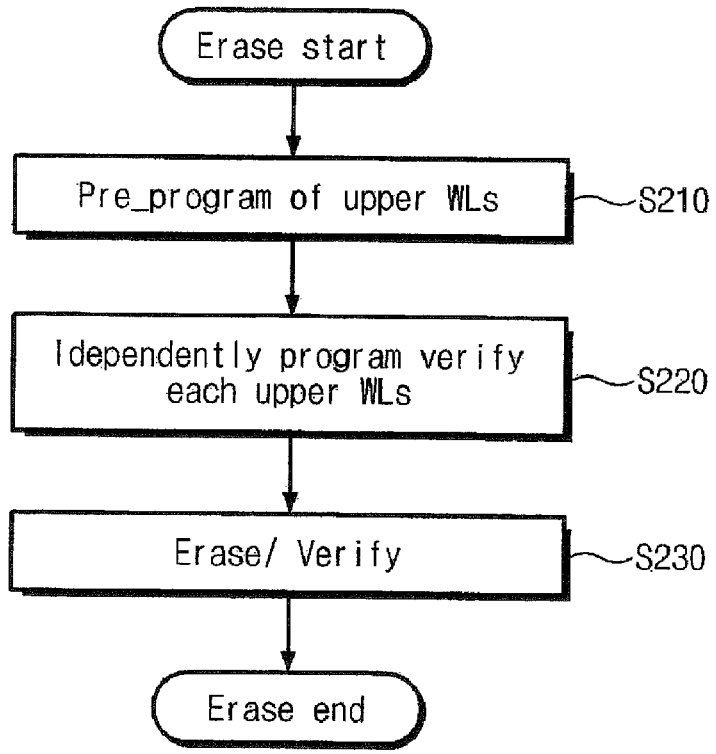

FIG. 14 is a flow chart of an erase routine according to another embodiment of the present invention. In a first step S210, a pre-program operation is executed in which upper word lines WL of a word line block are pre-programmed. See, for example, the upper word lines WL<25:30> of FIG. 9. Then, at step 220, an independent program verify operation is executed for each of the upper word lines WL. Then, at step S230, the memory block is erased and an erase verify operation is conducted to confirm the erase ("11") state of each memory cell.

Figure 15:
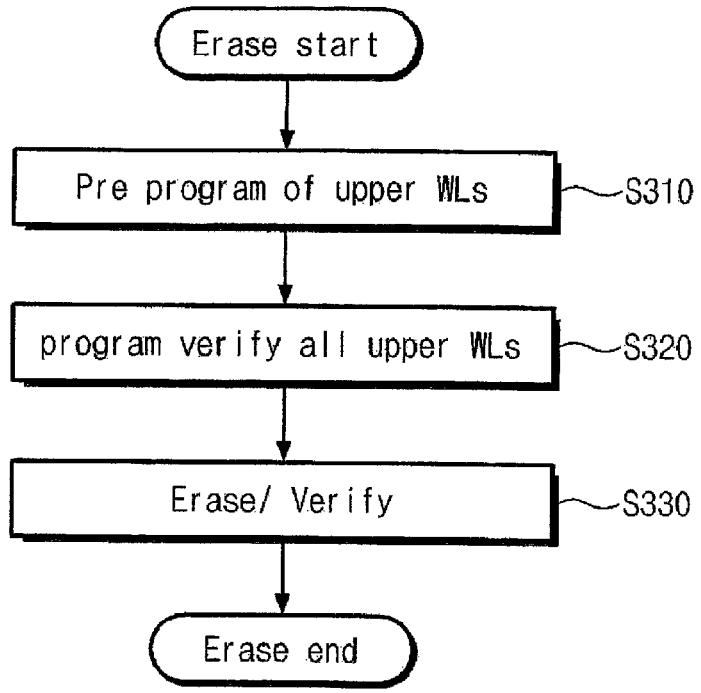

FIG. 15 is a flow chart of an erase routine according to another embodiment of the present invention. In a first step S310, a pre-program operation is executed in which upper word lines WL of a word line block are pre-programmed. See, for example, the upper word lines WL<25:30> of FIG. 9. Then, at step 320, an program verify operation is executed for all the upper word lines WL. Then, at step S330, the memory block is erased and an erase verify operation is conducted to confirm the erase ("11") state of each memory cell.

Figure 16:
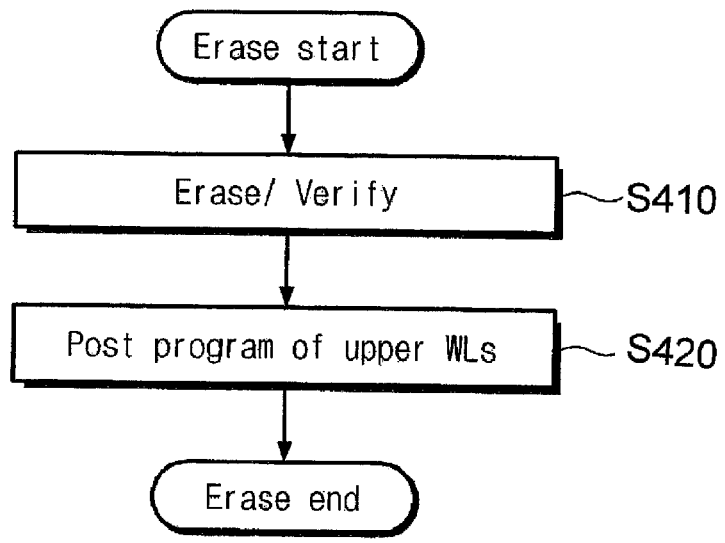

FIG. 16 is a flow chart of an erase routine according to another embodiment of the present invention. In a first step S410, the memory block is erased and an erase verify operation is conducted to confirm the erase ("11") state of each memory cell. Then, at step 420, a post-program operation is executed in which upper word lines WL of a word line block are post-programmed. See, for example, the upper word lines WL<25:30> of FIG. 9.

Figure 17:
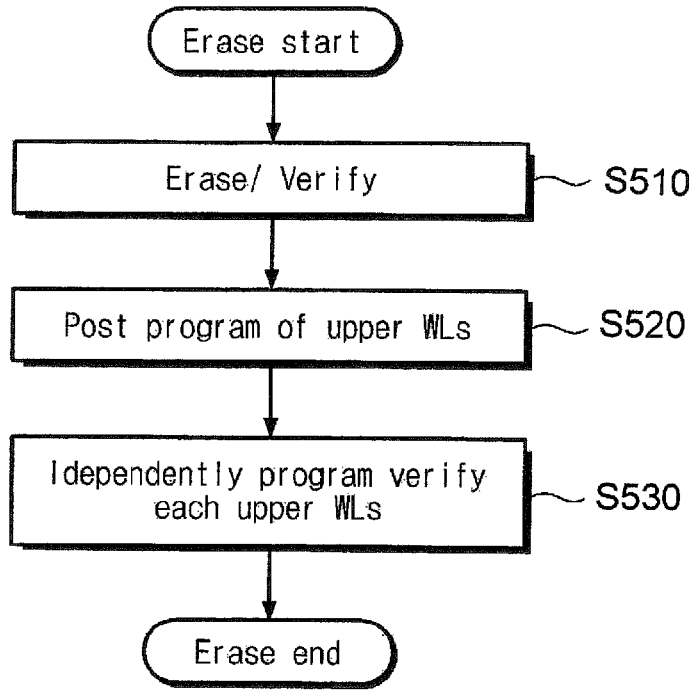

FIG. 17 is a flow chart of an erase routine according to another embodiment of the present invention. In a first step S510, the memory block is erased and an erase verify operation is conducted to confirm the erase ("11") state of each memory cell. Then, at step 520, a post-program operation is executed in which upper word lines WL of a word line block are post-programmed. See, for example, the upper word lines WL<25:30> of FIG. 9. Then, at step 530, an independent program verify operation is executed for each of the upper word lines WL.

Figure 18:
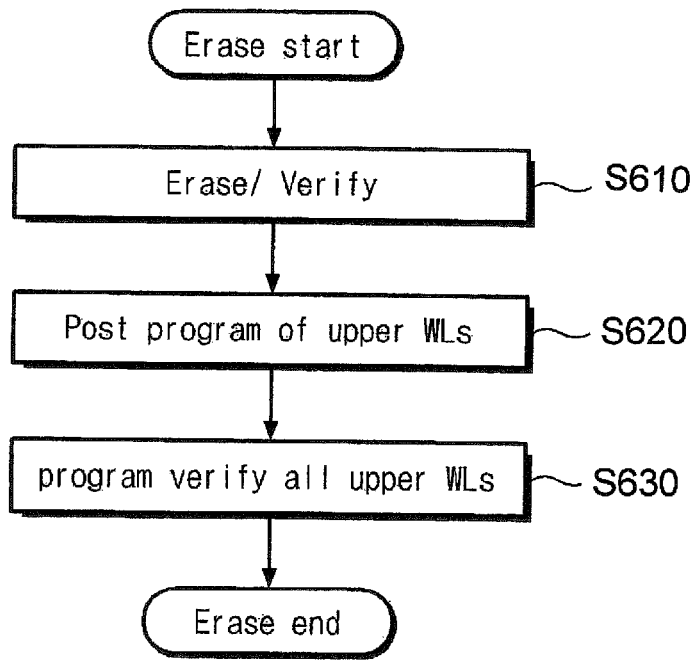

FIG. 18 is a flow chart of an erase routine according to another embodiment of the present invention. In a first step S610, the memory block is erased and an erase verify operation is conducted to confirm the erase ("11") state of each memory cell. Then, at step 620, a post-program operation is executed in which upper word lines WL of a word line block are post-programmed. See, for example, the upper word lines WL<25:30> of FIG. 9. Then, at step 630, a program verify operation is executed for all of the upper word lines WL.

Figure 19:
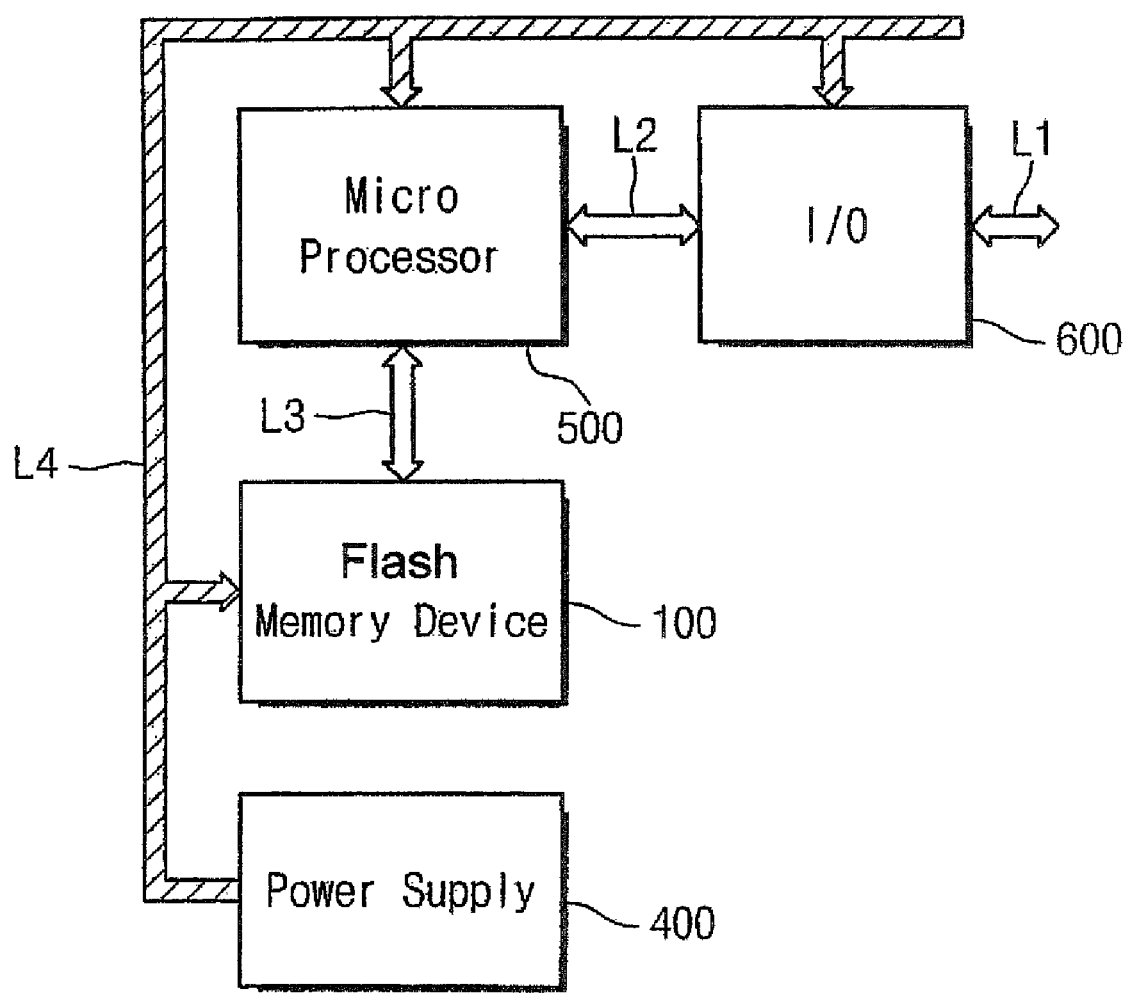
FIG. 19 is a block diagram of an electronic system according to an embodiment of the present invention.

FIG. 19 is a block diagram of an electronic system incorporating a NAND flash memory device 100 according to one or more previously described embodiments of the present invention. Non-limiting examples of the electronic system include portable systems such as mobile telephones, personal data assistants (PDA's), MP3 players, digital cameras, and hybrids of such devices, and non-portable systems such as personal computers and digital video recorders.

The NAND-flash memory device 100 is connected to a microprocessor 500 through a bus line L3, and may serve as a main memory or solid state drive (SSD) of the electronic system. Alternately, for example, the NAND-flash memory device 100 may be a removable flash card. A battery 400 supplies a power to the microprocessor 500, an input/output device (I/O) 600, and the memory device 100 through a power line L4. If data is provided to the I/O 600 through a line L1, the microprocessor 500 transfers the data to the memory device 100 through a line L3 after receiving and processing the data. The memory device 100 stores the transferred data in a memory cell thereof The data stored in the memory cell is read out by the microprocessor 500 and output to the outside through the I/O 600.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A non-volatile NAND-flash semiconductor memory device which is configured to execute at least one of a pre-program operation and a post-program operation as part of an erase operation, each of the pre-program and post-program operations of the erase operation including applying a program voltage to a subset only of a plurality of word lines defining a word line block of the memory device before and after erasing memory cells of the word line block, respectively, wherein the at least one of the pre-program operation and the post-program operations is executed with respect to an upper word line, wherein the upper word line includes at least one word line between a string selection line and a selected word line, wherein the selected word line is applied with a program voltage during a previous program operation.

2. The memory device of claim 1, wherein a pass voltage is applied to remaining word lines of the word line block during each of the at least one of the pre-program and post-program operations.

3. The memory device of claim 1, wherein the memory device is configured to execute a local boosting scheme during a normal programming operation.

4. The memory device of claim 1, wherein the memory device is configured to execute a local boosting scheme during each of at least one of the pre-program and post-program operations.

5. The memory device of claim 1, wherein the word lines defining the word line block include first through $n^{th}$ word lines, where n is a positive integer, and wherein a normal programming operation is sequentially executed in order from the first word line to the nth word line.

6. The memory device of claim 3, wherein the word lines defining the word line block include first through $n^{th}$ word lines, where n is a positive integer, and wherein programming progresses from the first word line to the $n^{th}$ word line in the normal programming operation.

7. The memory device of claim 5, wherein the subset of word lines includes at least the $(n-1)^{th}$ word line.

8. The memory device of claim 5, wherein each of the subset of word lines is contained among the $(n/2)^{th}$ through $n^{th}$ word lines.

9. The memory device of claim 1, wherein a same program voltage is applied to each of the subset of word lines in the at least one of the pre-program and post-program operations.

10. The memory device of claim 1, wherein different program voltages are applied to the subset of word lines in the at least one of the pre-program and post-program operations.

11. The memory device of claim 2, wherein a same pass voltage is applied to each of the remaining word lines in the at least one of the pre-program and post-program operations.

12. The memory device of claim 2, wherein different pass voltages are applied to the remaining word lines in the at least of the pre-program and post-program operations.

13. The memory device of claim 1, wherein the subset of word lines are sequentially arranged one after the other within the word line block.

14. The memory device of claim 1, wherein the subset of word lines non-sequentially arranged within the word line block.

15. A memory device, comprising:
a memory cell array comprising a plurality of non-volatile memory strings, each of the non-volatile memory strings including a plurality n of non-volatile memory cells, where n is an integer;
a plurality n of word lines intersecting the respective n non-volatile memory cells of each of the non-volatile memory strings;
a decoder configured to apply voltages to the word lines in response to an address;
an erase controller which supplies voltages to the decoder to execute at least one of a pre-program operation and a post-program operation as part of an erase operation, each of the pre-program and post-program operations of the erase operation including applying a program voltage to a subset only of a plurality of word lines defining a word line block of the memory device before and after erasing memory cells of the word line block, respectively,
wherein the at least one of the pre-program operation and the post-program operations is executed with respect to an upper word line, wherein the upper word line includes at least one word line between a string selection line and a selected word line, wherein the selected word line is applied with the program voltage during a previous program operation.

16. An electronic system, comprising a microprocessor operatively coupled to a non-volatile memory device which is configured to execute at least one of a pre-program operation and a post-program operation as part of an erase operation, respectively, each of the pre-program and post-program operations including applying a program voltage to a subset only of a plurality of word lines defining a word line block of the memory device before and after erasing memory cells of the word line block, respectively,
wherein the at least one of the pre-program operation and the post-program operations is executed with respect to an upper word line, wherein the upper word line includes at least one word line between a string selection line and a selected word line, wherein the selected word line is applied with a program voltage during a previous program operation.

17. The electronic device of claim 16, wherein electronic device is a portable electronic device.

18. The electronic device of claim 16, wherein the non-volatile memory is contained in a flash memory card.

19. A method of operating a NAND-type flash memory device including providing a program voltage to a subset of word lines of a word line block during at least one of a pre-program and post-program operation executed before or after an erase operation.

20. The method of claim 19, wherein a pass voltage is applied to remaining word lines of the word line block during the pre-program and post-program operation.

21. The method of claim 19, further comprising executing a local boosting scheme during a normal programming operation.

22. The memory device of claim 21, wherein the word lines defining the word line block include first through nth word lines, where n is a positive integer, and wherein the normal programming operation is sequentially executed in order from the first word line to the $n^{th}$ word line.

23. The memory device of claim 22, wherein the subset of word lines includes at least the $(n-1)^{th}$ word line.

24. The memory device of claim 22, wherein each of the subset of word lines is contained among the $(n/2)^{th}$ through nth word lines.

25. The memory device of claim 19, wherein a same program voltage is applied to each of the subset of word lines in the pre-programming and post-programming operations.

26. The memory device of claim 19, wherein different program voltages are applied to the subset of word lines in the pre-programming and post-programming operation.

27. The memory device of claim 20, wherein a same pass voltage is applied to each of the remaining word lines in the pre-programming and post-programming operations.

28. The memory device of claim 20, wherein different pass voltages are applied to the remaining word lines in the pre-programming and post-programming operation.

29. The memory device of claim 19, wherein the subset of word lines are sequentially arranged one after the other within the word line block.

30. The memory device of claim 19, wherein the subset of word lines are non-sequentially arranged within the word line block.

31. A method of controlling a NAND-type non-volatile memory device, comprising:
executing an erase operation which includes a pre-program operation in which a program voltage is applied to a first set of word lines of a word line block, and a pass voltage is applied to a remaining set of word lines of the word line block, and then erasing memory cells of the word line block after the pre-program operation, wherein the pre-program operation is executed with respect to an upper word line, wherein the upper word line includes at least one word line between a string selection line and a selected word line, wherein the selected word line is applied with the program voltage during a previous program operation.

32. The method of claim 31, further comprising executing an independent program verify operating for each of the first set of word lines before the erase operation and after the pre-program operation.

33. The method of claim 31, further comprising executing a program verify operating for all of the first set of word lines before the erase operation and after the pre-program operation.

34. A method of controlling a NAND-type non-volatile memory device, comprising:

executing an erase operation of a word line block which includes erasing memory cells of the word line block, and executing a post-program operation in which a program voltage is applied to a first set of word lines of a word line block, and a pass voltage is applied to a remaining set of word lines of the word line block, wherein the post-program operation is executed with respect to an upper word line, wherein the upper word line includes at least one word line between a string selection line and a selected word line, wherein the selected word line is applied with the program voltage during a previous program operation.

35. The method of claim 34, further comprising executing an independent program verify operating for each of the first set of word lines after the post-program operation.

36. The method of claim 35, further comprising executing a program verify operating for all of the first set of word lines after the post-program operation.

* * * * *